(12) United States Patent
Jang et al.

(10) Patent No.: US 10,714,642 B2
(45) Date of Patent: Jul. 14, 2020

(54) SOLAR CELL AND SOLAR CELL MODULE

(71) Applicant: LG ELECTRONICS INC., Seoul (KR)

(72) Inventors: Daehee Jang, Seoul (KR); Minpyo Kim, Seoul (KR); Bojoong Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 480 days.

(21) Appl. No.: 15/211,684

(22) Filed: Jul. 15, 2016

(65) Prior Publication Data

US 2017/0018671 A1    Jan. 19, 2017

(30) Foreign Application Priority Data

Jul. 15, 2015    (KR) .................. 10-2015-0100605

(51) Int. Cl.
*H01L 31/0224* (2006.01)
*H01L 31/05* (2014.01)
*H01L 31/068* (2012.01)

(52) U.S. Cl.
CPC .. *H01L 31/0516* (2013.01); *H01L 31/022425* (2013.01); *H01L 31/022433* (2013.01);
(Continued)

(58) Field of Classification Search
CPC ... H01L 31/00; H01L 31/02; H01L 31/02002; H01L 31/02008; H01L 31/0201;
(Continued)

(56) References Cited

U.S. PATENT DOCUMENTS

2013/0269771 A1* 10/2013 Cheun ............. H01L 31/022441
136/256
2014/0326295 A1   11/2014 Moslehi
(Continued)

FOREIGN PATENT DOCUMENTS

JP    3-165578 A    7/1991
JP    8-274356 A    10/1996
(Continued)

OTHER PUBLICATIONS

English machine translation of Mishima (JP 2009-188355), published Aug. 20, 2009.*
(Continued)

*Primary Examiner* — Christina Chern
(74) *Attorney, Agent, or Firm* — Birch, Stewart, Kolasch & Birch, LLP

(57) ABSTRACT

A solar cell and a solar cell module are disclosed. The solar cell includes a semiconductor substrate, an emitter region extending in a first direction, a back surface field region extending in the first direction in parallel with the emitter region, a first electrode connected to the emitter region and extending in the first direction, and a second electrode connected to the back surface field region and extending in the first direction. The first electrode has different linewidths at two positions that are separated from each other in the first direction. The second electrode has different linewidths at two positions that are separated from each other in the first direction. A linewidth of the first electrode and a linewidth of the second electrode are different from each other at two positions that are separated from each other in a second direction crossing the first direction.

11 Claims, 9 Drawing Sheets

(52) U.S. Cl.
CPC .. *H01L 31/022441* (2013.01); *H01L 31/0682* (2013.01); *Y02E 10/547* (2013.01)

(58) Field of Classification Search
CPC ......... H01L 31/0224; H01L 31/022425; H01L 31/022433; H01L 31/022441
See application file for complete search history.

(56) References Cited

U.S. PATENT DOCUMENTS

2015/0013742 A1\* 1/2015 Lin ................ H01L 31/022441
                                                                                                     136/244
2015/0114453 A1 4/2015 Woo et al.
2016/0365469 A1\* 12/2016 Steckemetz ..... H01L 31/022433

FOREIGN PATENT DOCUMENTS

| JP | 2005-317886 A | 10/2005 |
|---|---|---|
| JP | 2009-188355 A | 8/2009 |
| JP | 2011-3724 A | 1/2011 |
| JP | 2011-151305 A | 8/2011 |
| JP | 2013-77821 A | 4/2013 |
| KR | 10-2010-0064478 A | 6/2010 |
| KR | 10-2011-0014231 A | 2/2011 |
| KR | 10-2012-116120 A | 10/2012 |
| WO | WO 2009/025147 A1 | 2/2009 |
| WO | WO 2012/081813 A1 | 6/2012 |

OTHER PUBLICATIONS

Verlinden et al., "Multilevel Metallization for Large Area Point-contact Solar Cells," IEEE, Sep. 26, 1988, pp. 532-537, XP010070559.

\* cited by examiner

SOLAR CELL AND SOLAR CELL MODULE

CROSS-REFERENCE TO RELATED APPLICATION

This application claims priority to and the benefit of Korean Patent Application No. 10-2015-0100605 filed in the Korean Intellectual Property Office on Jul. 15, 2015, the entire content of which is incorporated herein by reference.

BACKGROUND OF THE INVENTION

Field of the Invention

The present disclosure relates to a solar cell and a solar cell module.

Description of the Related Art

Recently, as existing energy sources such as petroleum and coal are expected to be depleted, interests in alternative energy sources for replacing the existing energy sources are increasing. Among the alternative energy sources, solar cells for generating electric energy from solar energy have been particularly spotlighted.

A solar cell generally includes semiconductor parts, which respectively have different conductive types, for example, a p-type and an n-type and thus form a p-n junction, and electrodes respectively connected to the semiconductor parts of the different conductive types.

When light is incident on the solar cell, a plurality of electron-hole pairs are produced in the semiconductor parts and are separated into electrons and holes by the incident light. The electrons move to the n-type semiconductor part, and the holes move to the p-type semiconductor part. Then, the electrons and the holes are collected by the different electrodes respectively connected to the n-type semiconductor part and the p-type semiconductor part. The electrodes are connected to each other using electric wires to thereby obtain electric power.

A plurality of solar cells having the above-described configuration may be connected to one another through interconnectors to form a module.

SUMMARY OF THE INVENTION

In one aspect, there is provided a solar cell including a semiconductor substrate doped with impurities of a first conductive type, an emitter region doped with impurities of a second conductive type opposite the first conductive type and extending in a first direction, a back surface field region more heavily doped than the semiconductor substrate with impurities of the first conductive type and extending in the first direction in parallel with the emitter region, a first electrode electrically connected to the emitter region and extending in the first direction, and a second electrode electrically connected to the back surface field region and extending in the first direction, wherein the first electrode has different linewidths at two positions that are separated from each other in the first direction, wherein the second electrode has different linewidths at two positions that are separated from each other in the first direction, and wherein a linewidth of the first electrode and a linewidth of the second electrode are different from each other at two positions that are separated from each other in a second direction crossing the first direction.

As the first electrode goes along the first direction, the first electrode may repeatedly have a portion having a first maximum linewidth and a portion having a first minimum linewidth less than the first maximum linewidth. As the second electrode goes along the first direction, the second electrode may repeatedly have a portion having a second maximum linewidth and a portion having a second minimum linewidth less than the second maximum linewidth. The linewidth of the first electrode may gradually increase or decrease between the first minimum linewidth and the first maximum linewidth, and the linewidth of the second electrode may gradually increase or decrease between the second minimum linewidth and the second maximum linewidth.

More specifically, the portion of the first electrode having the first maximum linewidth and the portion of the second electrode having the second minimum linewidth may be positioned on the same line in the second direction. The portion of the first electrode having the first minimum linewidth and the portion of the second electrode having the second maximum linewidth may be positioned on the same line in the second direction.

When the linewidth of the first electrode increases from the first minimum linewidth to the first maximum linewidth, an angle formed when increasing the linewidth of the first electrode may be 5° to 85° with respect to the first direction.

When the linewidth of the second electrode increases from the second minimum linewidth to the second maximum linewidth, an angle formed when increasing the linewidth of the second electrode may be 5° to 85° with respect to the first direction.

The angle formed when increasing the linewidth of the second electrode may be equal to or less than the angle formed when increasing the linewidth of the first electrode. The first maximum linewidth may be greater than the second maximum linewidth, and the first minimum linewidth may be equal to or greater than the second minimum linewidth.

An average linewidth of the first electrode may be greater than an average linewidth of the second electrode. A ratio of the average linewidth of the second electrode to the average linewidth of the first electrode may be 1:1.5 to 1:3.

A ratio of the first minimum linewidth to the first maximum linewidth of the first electrode may be 1:2 to 1:10. A ratio of the second minimum linewidth to the second maximum linewidth of the second electrode may be 1:2 to 1:8.

As each of the emitter region and the back surface field region goes along the first direction, each of the emitter region and the back surface field region may have a stripe shape having a uniform linewidth.

An average linewidth of one of the emitter region and the back surface field region may be greater than an average linewidth of the other.

A linewidth of each of the emitter region and the back surface field region may be repeatedly and gradually changed as the emitter region and the back surface field region go along the first direction.

The emitter region may have a maximum linewidth in the portion of the first electrode having the first maximum linewidth and have a minimum linewidth in the portion of the first electrode having the first minimum linewidth. The back surface field region may have a maximum linewidth in the portion of the second electrode having the second maximum linewidth and have a minimum linewidth in the portion of the second electrode having the second minimum linewidth.

In another aspect, there is provided a solar module including a plurality of solar cells each including a semiconductor substrate and a plurality of first and second electrodes positioned on a back surface of the semiconductor substrate and extending in a first direction, a plurality of first conductive lines electrically connected to a plurality of first electrodes included in a first solar cell of adjacent first and second solar cells among the plurality of solar cells and extending in a second direction crossing the first direction, and a plurality of second conductive lines electrically connected to a plurality of second electrodes included in the second solar cell and extending in the second direction, wherein the first electrode has different linewidths at a crossing of the first conductive line and the first electrode and a crossing of the second conductive line and the first electrode, the crossings being separated from each other in the first direction, wherein the second electrode has different linewidths at a crossing of the first conductive line and the second electrode and a crossing of the second conductive line and the second electrode, the crossings being separated from each other in the first direction, and wherein a linewidth of the first electrode at the crossing of the first electrode and the first conductive line or the second conductive line is different from a linewidth of the second electrode at the crossing of the second electrode and the first conductive line or the second conductive line, the crossings being separated from each other in the second direction.

The first electrode may have a maximum linewidth at a position where the first electrode and the first conductive line cross each other and are electrically connected to each other, and have a minimum linewidth at a position where the first electrode and the second conductive line cross each other and are insulated from each other, the positions being separated from each other in the first direction. The second electrode may have a minimum linewidth at a position where the second electrode and the first conductive line cross each other and are insulated from each other, and have a maximum linewidth at a position where the second electrode and the second conductive line cross each other and are electrically connected to each other, the positions being separated from each other in the first direction.

A ratio of the minimum linewidth of the second electrode to the maximum linewidth of the first electrode may be 1:2 to 1:10. A ratio of the minimum linewidth of the first electrode to the maximum linewidth of the second electrode may be 1:2 to 1:8.

A ratio of the minimum linewidth of the second electrode to the maximum linewidth of the first electrode may be different from a ratio of the minimum linewidth of the first electrode to the maximum linewidth of the second electrode.

The linewidth of each of the first and second electrodes may gradually increase or decrease between the minimum linewidth and the maximum linewidth.

Each of the plurality of solar cells may further include an emitter region doped with impurities of a second conductive type opposite the first conductive type of the semiconductor substrate and extending in the first direction, and a back surface field region more heavily doped than the semiconductor substrate with impurities of the first conductive type and extending in the first direction in parallel with the emitter region. The maximum linewidth of the first electrode connected to the emitter region may be greater than the maximum linewidth of the second electrode connected to the back surface field region.

The minimum linewidth of the second electrode connected to the back surface field region may be less than the minimum linewidth of the first electrode connected to the emitter region.

An average linewidth of the first electrode connected to the emitter region may be greater than an average linewidth of the second electrode connected to the back surface field region.

The first electrode may be electrically connected to the first conductive line through a conductive adhesive and may be insulated from the second conductive line through an insulating layer. The second electrode may be electrically connected to the second conductive line through the conductive adhesive and may be insulated from the first conductive line through the insulating layer.

A linewidth of the emitter region and a linewidth of the back surface field region may be uniform along the first direction or may increase or decrease in response to a change in the linewidths of the first and second electrodes along the first direction.

The plurality of first conductive lines connected to the first solar cell and the plurality of second conductive lines connected to the second solar cell may overlap each other and may be connected or are formed as one body.

The plurality of first conductive lines connected to the first solar cell and the plurality of second conductive lines connected to the second solar cell may be commonly connected to an intercell connector that is disposed between the first and second solar cells and extends in the first direction.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Figure 1:
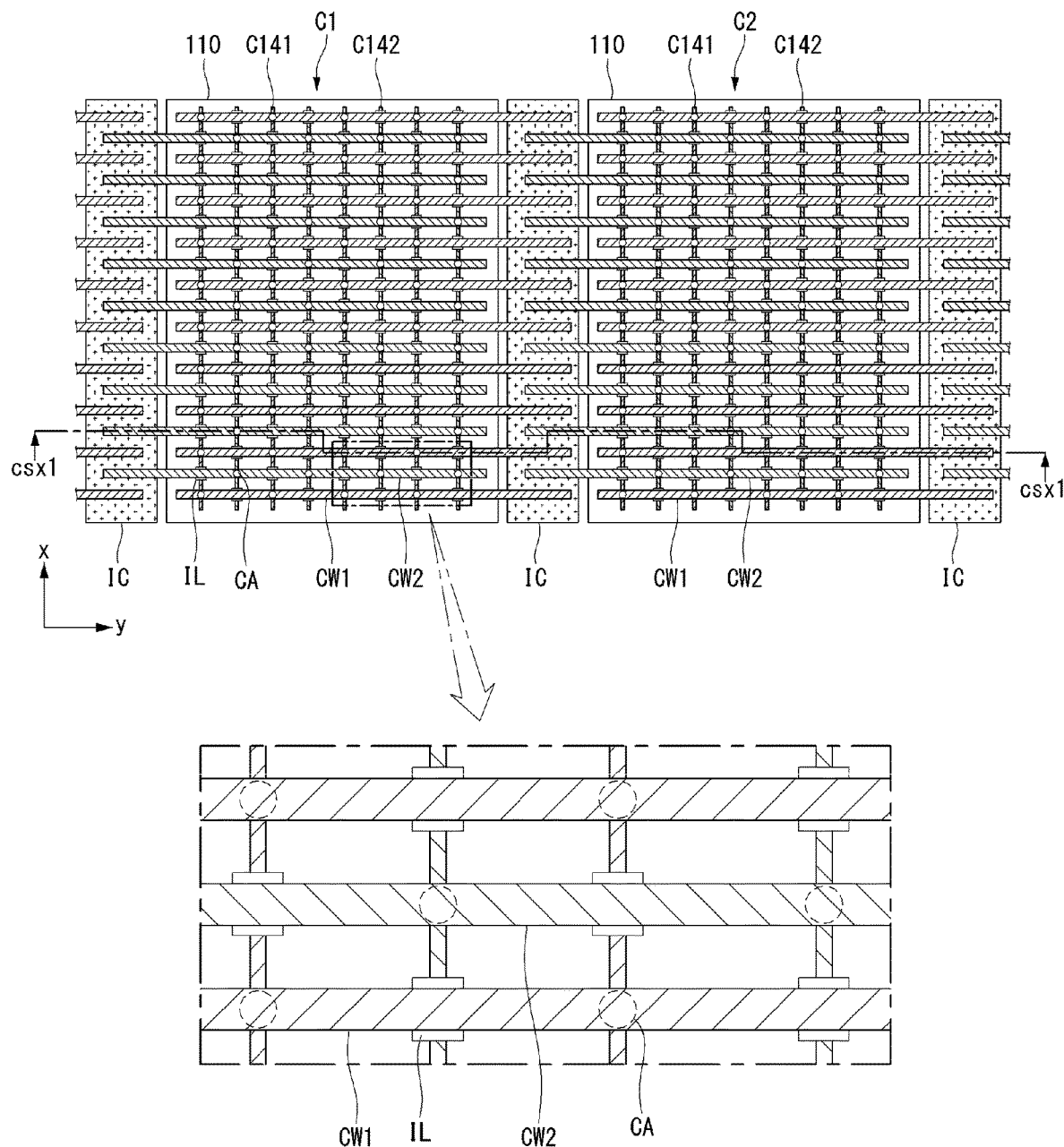
FIG. 1 illustrates an example of a string applied to a solar cell module according to an embodiment of the invention when viewed from a back surface side.

Reference will now be made in detail to embodiments of the invention, examples of which are illustrated in the accompanying drawings. This invention may, however, be embodied in many different forms and should not be construed as limited to the embodiments set forth herein. Wherever possible, the same reference numbers will be used throughout the drawings to refer to the same or like parts. It will be noted that a detailed description of known arts will be omitted if it is determined that the detailed description of the known arts can obscure the embodiments of the invention.

In the drawings, the thickness of layers, films, panels, regions, etc., are exaggerated for clarity. It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, it will be understood that when an element such as a layer, film, region, or substrate is referred to as being "entirely" on other element, it may be on the entire surface of the other element and may not be on a portion of an edge of the other element.

In the following description, "front surface" may be one surface of a semiconductor substrate, on which light is directly incident, and "back surface" may be a surface opposite the one surface of the semiconductor substrate, on which light is not directly incident or reflective light may be incident.

FIGS. 1 to 6 illustrate an example of a solar cell module according to an embodiment of the invention.

Figure 2:
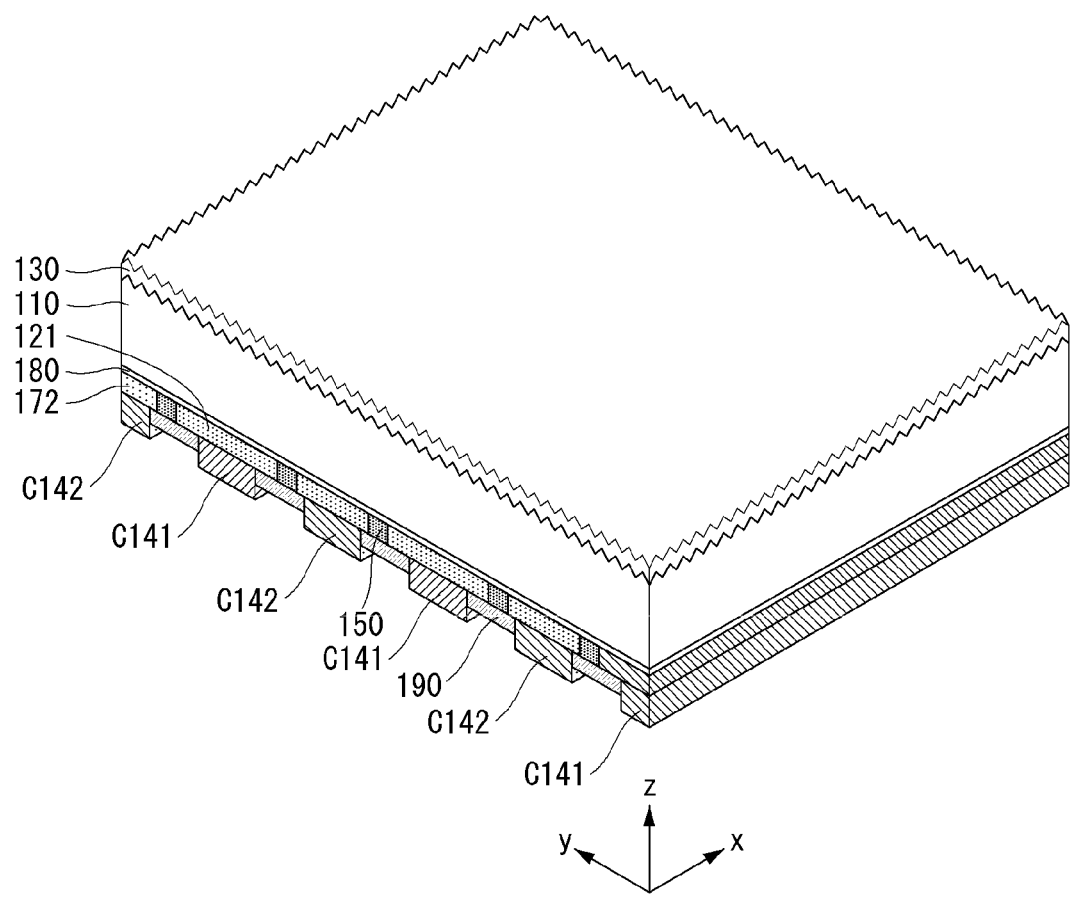
FIG. 2 is a partial perspective view illustrating an example of a solar cell applied to a solar cell module shown in FIG. 1.
Figure 3:
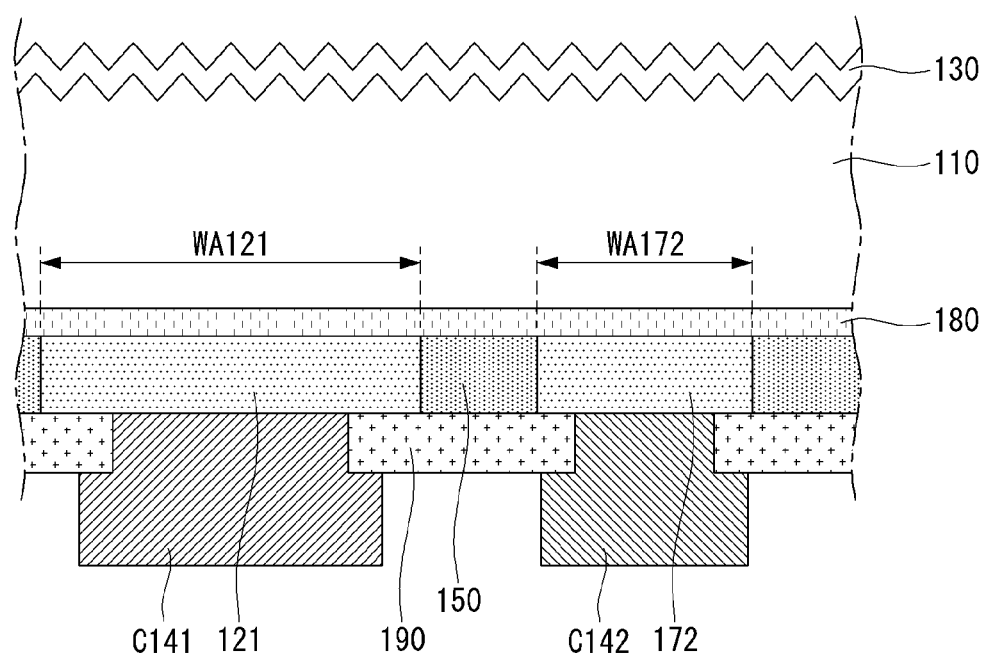
FIG. 3 is a cross-sectional view of a solar cell shown in FIG. 2 in a second direction.

More specifically, FIG. 1 illustrates an example of a string applied to a solar cell module according to an embodiment of the invention when viewed from a back surface side. FIG. 2 is a partial perspective view illustrating an example of a solar cell applied to a solar cell module shown in FIG. 1. FIG. 3 is a cross-sectional view of a solar cell shown in FIG. 2 in a second direction.

As shown in FIG. 1, a solar cell module according to an embodiment of the invention includes a plurality of solar cells C1 and C2, a plurality of first and second conductive lines CW1 and CW2 connected to a plurality of first and second electrodes C141 and C142 formed on a back surface of each of the plurality of solar cells C1 and C2, and an intercell connector IC that is connected to the plurality of first and second conductive lines CW1 and CW2 and connects the plurality of solar cells C1 and C2 in series.

In the embodiment disclosed herein, each of the plurality of solar cells C1 and C2 includes a semiconductor substrate 110 and the plurality of first and second electrodes C141 and C142 that are separated from each other on a back surface of the semiconductor substrate 110 and extend in a first direction x.

The plurality of conductive lines CW1 and CW2 may electrically connect a plurality of first electrodes C141 included in one solar cell of two adjacent solar cells among a plurality of solar cells to a plurality of second electrodes C142 included in the other solar cell in series.

To this end, the plurality of conductive lines CW1 and CW2 may extend in a second direction y crossing a longitudinal direction (i.e., the first direction x) of the first and second electrodes C141 and C142 and may be connected to each of the plurality of solar cells.

For example, the plurality of conductive lines CW1 and CW2 may include a plurality of first conductive lines CW1 and a plurality of second conductive lines CW2. As shown in FIG. 1, the first conductive line CW1 may be connected to the first electrode C141 included in each solar cell using a conductive adhesive CA and may be insulated from the second electrode C142 of each solar cell through an insulating layer IL formed of an insulating material.

Further, the second conductive line CW2 may be connected to the second electrode C142 included in each solar cell using a conductive adhesive CA and may be insulated from the first electrode C141 of each solar cell through an insulating layer IL formed of an insulating material.

Each of the first and second conductive lines CW1 and CW2 may have a conductive wire shape having a circular cross section or a ribbon shape, in which a linewidth is greater than a thickness.

For example, when the first and second conductive lines CW1 and CW2 have the ribbon shape, a linewidth of each of the first and second conductive lines CW1 and CW2 may be 0.5 mm to 2.5 mm, and a thickness thereof may be 0.05 mm to 0.5 mm.

Each of the first and second conductive lines CW1 and CW2 may be connected to the intercell connector IC that is disposed between the plurality of solar cells C1 and C2 and extends in the first direction x. Hence, the plurality of solar cells C1 and C2 may be connected in series to each other in the second direction y.

FIG. 1 shows that the number of each of the first and second conductive lines CW1 and CW2 is ten, as an example. However, the number of each of the first and second conductive lines CW1 and CW2 may be ten to twenty in consideration of a lumped resistance and a contact resistance of each of the first and second conductive lines CW1 and CW2 and a fill factor of each solar cell.

In FIG. 1, a linewidth of each of the first and second electrodes C141 and C142 may be changed as it goes toward (or along) the longitudinal direction, so that a contact resistance between the conductive lines and the first and second electrodes C141 and C142 and a lumped resistance of the first and second electrodes C141 and C142 are reduced.

More specifically, the first electrode C141 may have different linewidths at two positions which are separated from each other in the first direction x, and the second electrode C142 may have different linewidths at two positions which are separated from each other in the first direction x. A linewidth of the first electrode C141 and a linewidth of the second electrode C142 may be different from each other at two positions which are separated from each other in the second direction y crossing the first direction x. This is described in detail later.

The embodiment of the invention is illustrated and described using an example where the solar cell module according to the embodiment of the invention includes the intercell connector. However, the intercell connector may be omitted. When the intercell connector is omitted, the first and second conductive lines CW1 and CW2 may be connected to each other while overlapping each other or may be formed as one body, thereby connecting the plurality solar cells C1 and C2 in series.

Each of the plurality of solar cells is described in detail below.

As shown in FIGS. 2 and 3, a solar cell according to the embodiment of the invention may include an anti-reflection layer 130, a semiconductor substrate 110, a tunnel layer 180, a plurality of emitter regions 121, a plurality of back surface field regions 172, a plurality of intrinsic semiconductor layers 150, a passivation layer 190, a plurality of first electrodes C141, and a plurality of second electrodes C142.

In the embodiment disclosed herein, the anti-reflection layer 130, the intrinsic semiconductor layer 150, the tunnel layer 180, and the passivation layer 190 may be omitted, if desired or necessary. However, when the solar cell includes them, efficiency of the solar cell may be further improved. Thus, the embodiment of the invention is described using the solar cell including the anti-reflection layer 130, the intrinsic semiconductor layer 150, the tunnel layer 180, and the passivation layer 190, as an example.

The semiconductor substrate 110 may be formed of at least one of single crystal silicon and polycrystalline silicon containing impurities of a first conductive type. For example, the semiconductor substrate 110 may be formed of a single crystal silicon wafer.

In the embodiment disclosed herein, the first conductive type may be one of an n-type and a p-type.

When the semiconductor substrate 110 is of the p-type, the semiconductor substrate 110 may be doped with impurities of a group III element, such as boron (B), gallium (Ga), and indium (In). Alternatively, when the semiconductor substrate 110 is of the n-type, the semiconductor substrate 110 may be doped with impurities of a group V element, such as phosphorus (P), arsenic (As), and antimony (Sb).

In the following description, the embodiment of the invention is described using an example where the first conductive type is the n-type.

A front surface of the semiconductor substrate 110 may be an uneven surface having a plurality of uneven portions or having uneven characteristics. Thus, the emitter regions 121 positioned on the front surface of the semiconductor substrate 110 may have an uneven surface.

Hence, an amount of light reflected from the front surface of the semiconductor substrate 110 may decrease, and an amount of light incident on the inside of the semiconductor substrate 110 may increase.

The anti-reflection layer 130 may be positioned on the front surface of the semiconductor substrate 110, so as to minimize a reflection of light incident on the front surface of the semiconductor substrate 110 from the outside. The anti-reflection layer 130 may be formed of at least one of aluminum oxide (AlOx), silicon nitride (SiNx), silicon oxide (SiOx), and silicon oxynitride (SiOxNy).

The tunnel layer 180 is disposed on an entire back surface of the semiconductor substrate 110 while directly contacting the entire back surface of the semiconductor substrate 110 and may include a dielectric material. Thus, as shown in FIGS. 2 and 3, the tunnel layer 180 may pass through carriers produced in the semiconductor substrate 110.

In other words, the tunnel layer 180 may pass through carriers produced in the semiconductor substrate 110 and may perform a passivation function with respect to the back surface of the semiconductor substrate 110.

The tunnel layer 180 may be formed of a dielectric material including silicon carbide (SiCx) or silicon oxide (SiOx) having strong durability at a high temperature equal to or higher than 600° C. Other materials may be used. For example, the tunnel layer 180 may be formed of silicon nitride (SiNx), hydrogenated SiNx, aluminum oxide (AlOx), silicon oxynitride (SiON), or hydrogenated SiON. A thickness of the tunnel layer 180 may be 0.5 nm to 2.5 nm.

The plurality of emitter regions 121 is disposed on the back surface of the semiconductor substrate 110, and more specifically directly contacts a portion of a back surface of the tunnel layer 180. The plurality of emitter regions 121 extends in the first direction x. The emitter regions 120 may be formed of polycrystalline silicon material of a second conductive type opposite the first conductive type. The emitter regions 120 may form a p-n junction together with the semiconductor substrate 110 with the tunnel layer 180 interposed therebetween.

Because each emitter region 121 forms the p-n junction together with the semiconductor substrate 110, the emitter region 121 may be of the p-type.

However, if the semiconductor substrate 110 is of the p-type unlike the embodiment described above, the emitter region 121 may be of the n-type.

Returning to the embodiment of the invention, when the emitter region 121 is of the p-type, the emitter region 121 may be doped with impurities of a group III element such as B, Ga, and In. On the contrary, if the emitter region 121 is of the n-type, the emitter region 121 may be doped with impurities of a group V element such as P, As, and Sb.

The plurality of back surface field regions 172 is disposed on the back surface of the semiconductor substrate 110. More specifically, the plurality of back surface field regions 172 may directly contact a portion (separated from each of the plurality of emitter regions 121) of the back surface of the tunnel layer 180. The plurality of back surface field regions 172 may extend in the first direction x parallel to the plurality of emitter regions 121.

The back surface field regions 172 may be formed of polycrystalline silicon material more heavily doped than the semiconductor substrate 110 with impurities of the first conductive type. Thus, when the semiconductor substrate 110 is doped with, for example, n-type impurities, each of the plurality of back surface field regions 172 may be an n+-type region.

A potential barrier is formed by a difference between impurity concentrations of the semiconductor substrate 110 and the back surface field regions 172. Hence, the back surface field regions 172 can prevent or reduce holes from moving to the back surface field regions 172 used as a moving path of electrons through the potential barrier and can make it easier for carriers (for example, electrons) to move to the back surface field regions 172.

Thus, the embodiment of the invention can reduce an amount of carriers lost by a recombination and/or a disappearance of electrons and holes at and around the back surface field regions 172 or at and around the first and second electrodes C141 and C142 and can accelerates a movement of electrons, thereby increasing an amount of electrons moving to the back surface field regions 172.

FIGS. 2 and 3 illustrate that the emitter regions 121 and the back surface field regions 172 are formed on the back surface of the tunnel layer 180 using polycrystalline silicon material, as an example. Unlike this, if the tunnel layer 180 is omitted, the emitter regions 121 and the back surface field regions 172 may be doped by diffusing impurities into the back surface of the semiconductor substrate 110. In this instance, the emitter regions 121 and the back surface field regions 172 may be formed of the same material as the semiconductor substrate 110, for example, single crystal silicon.

As shown in FIGS. 2 and 3, an average linewidth of the emitter region 121 may be greater than an average linewidth of the back surface field region 172. As described above, when the average linewidth of the emitter region 121 is greater than the average linewidth of the back surface field region 172, an amount of carriers moving to the emitter regions 121 may further increase.

The intrinsic semiconductor layer 150 may be formed on the back surface of the tunnel layer 180 exposed between the emitter region 121 and the back surface field region 172 while directly contacting the exposed back surface of the tunnel layer 180. The intrinsic semiconductor layer 150 may be formed as an intrinsic polycrystalline silicon layer, that is not doped with impurities of the first conductive type and impurities of the second conductive type, unlike the emitter region 121 and the back surface field region 172.

Thus, the intrinsic semiconductor layer 150 may be formed using the same method as the emitter region 121 and the back surface field region 172, except that impurities of the first and second conductive types are doped. Further, the intrinsic semiconductor layer 150 may be formed together when the emitter region 121 and the back surface field region 172 are formed.

The intrinsic semiconductor layer 150 may be formed in a separation space between the emitter region 121 and the back surface field region 172 in the back surface of the tunnel layer 180. Further, as shown in FIGS. 2 and 3, the intrinsic semiconductor layer 150 may be configured such that both sides directly contact the side of the emitter region 121 and the side of the back surface field region 172, respectively.

The passivation layer 190 removes a defect resulting from a dangling bond formed in a back surface of a polycrystalline silicon layer formed at the back surface field regions 172, the intrinsic semiconductor layers 150, and the emitter regions 121, and thus can prevent carriers produced in the semiconductor substrate 110 from being recombined and disappeared by the dangling bond.

For this, the passivation layer 190 may fully cover the back surface of the intrinsic semiconductor layer 150, cover a remaining portion excluding a portion connected to the first electrode C141 from a back surface of the emitter region 121, and cover a remaining portion excluding a portion connected to the second electrode C142 from a back surface of the back surface field region 172.

The passivation layer 190 may be formed of a dielectric material. For example, the passivation layer 190 may be formed of at least one of hydrogenated silicon nitride (SiNx:H), hydrogenated silicon oxide (SiOx:H), hydrogenated silicon nitride oxide (SiNxOy:H), hydrogenated silicon oxynitride (SiOxNy:H), and hydrogenated amorphous silicon (a-Si:H).

The first electrode C141 may be connected to one of the emitter region 121 and the back surface field region 172 and may extend in the first direction x. For example, the first electrode C141 may be connected to the emitter region 121 while overlapping the emitter region 121 and may collect carriers (for example, holes) moving to the emitter region 121.

The second electrode C142 may be connected to the other of the emitter region 121 and the back surface field region 172 and may extend in the first direction x in parallel with the first electrode C141. For example, the second electrode C142 may be connected to the back surface field region 172 while overlapping the back surface field region 172 and may collect carriers (for example, electrons) moving to the back surface field region 172.

The plurality of first and second electrodes C141 and C142 may be formed of a conductive metal material. For example, the plurality of first and second electrodes C141 and C142 may be formed of at least one conductive material selected from the group consisting of nickel (Ni), copper (Cu), silver (Ag), aluminum (Al), tin (Sn), zinc (Zn), indium (In), titanium (Ti), gold (Au), and a combination thereof. Alternatively, the plurality of first and second electrodes C141 and C142 may be formed of a transparent conductive metal material, for example, using transparent conductive oxide (TCO).

In FIGS. 2 and 3, the first electrode C141 may have different linewidths at two positions which are separated from each other in the first direction x, and the second electrode C142 may have different linewidths at two positions which are separated from each other in the first direction x.

Further, the first electrode C141 and the second electrode C142, which are positioned in parallel with each other, may have different linewidths at two positions which are separated from each other in the second direction y crossing the first direction x.

The linewidths described above are described on the assumption that the first conductive type of the semiconductor substrate 110 is the n-type, the first electrode C141 is connected to the emitter region 121, and the second electrode C142 is connected to the back surface field region 172.

A pattern of the first and second electrodes C141 and C142 according to the embodiment of the invention is described in detail below with reference to FIG. 4.

Figure 4:
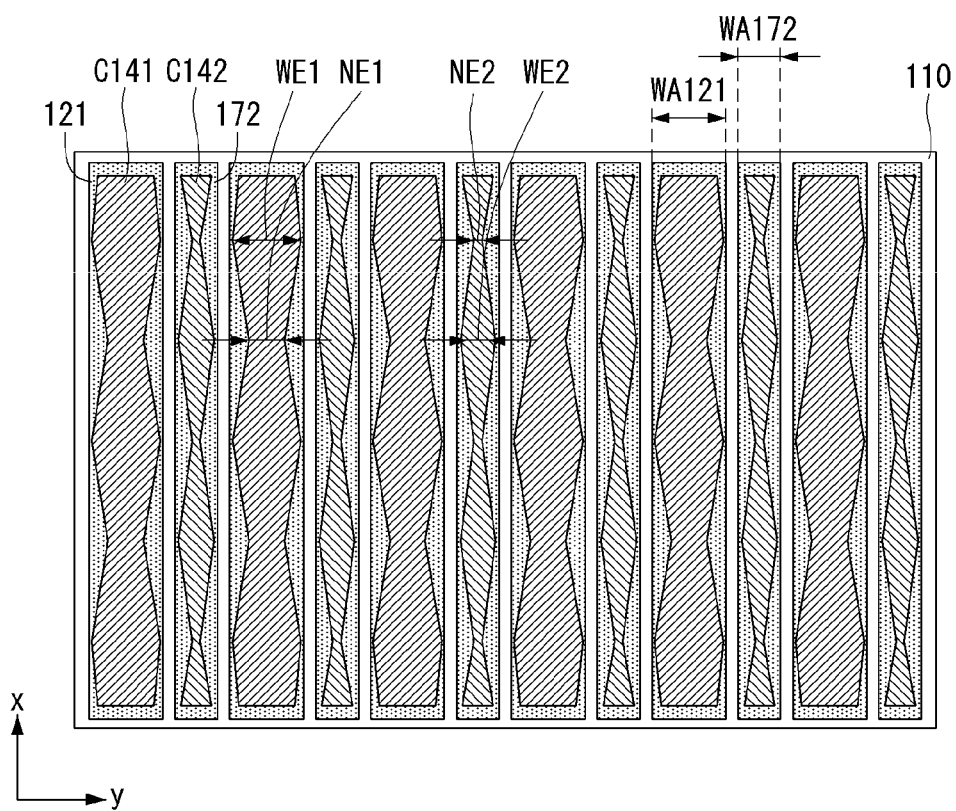
FIG. 4 illustrates an example of an entire pattern of an emitter region, a back surface field region, and first and second electrodes disposed on a back surface of a semiconductor substrate shown in FIGS. 2 and 3.

FIG. 4 illustrates an example of an entire pattern of an emitter region, a back surface field region, and first and second electrodes disposed on a back surface of a semiconductor substrate shown in FIGS. 2 and 3.

The passivation layer disposed on the back surface of the semiconductor substrate 110 is not shown in FIG. 4 for the sake of brevity and ease of reading.

As shown in FIG. 4, each of the emitter region 121 and the back surface field region 172 may be formed on the back surface of the semiconductor substrate 110 and may extend in the first direction x. The first electrode C141 may overlap the emitter region 121 and extend in the first direction x, and the second electrode C142 may overlap the back surface field region 172 and extend in the first direction x.

In FIG. 4, the emitter region 121 and the back surface field region 172 may respectively have a uniform linewidth WA121 and a uniform linewidth WA172 as they go toward the first direction x. Namely, the linewidth WA121 of the emitter region 121 and the linewidth WA172 of the back surface field region 172 may be uniformly formed without a change in the linewidth as they go toward the first direction x.

Further, the average linewidth WA121 of the emitter region 121 may be greater than the average linewidth WA172 of the back surface field region 172, so as to further increase an amount of holes moving to the emitter region 121.

As shown in FIG. 4, the first electrode C141 may have different linewidths at two positions which are separated from each other in the first direction x, and the second electrode C142 may have different linewidths at two positions which are separated from each other in the first direction x.

For example, as each of the first and second electrodes C141 and C142 goes toward (or along) the first direction x, portions having maximum linewidths WE1 and WE2 and portions having minimum linewidths NE1 and NE2 less than the maximum linewidths and WE2 may be repeatedly formed in each of the first and second electrodes C141 and C142.

More specifically, as the first electrode C141 goes toward (or along) the first direction x, the first electrode C141 may be formed by repeatedly disposing a portion having a first maximum linewidth WE1 and a portion having a first minimum linewidth NE1.

Further, as the second electrode C142 goes toward (or along) the first direction x, the second electrode C142 may be formed by repeatedly disposing a portion having a second maximum linewidth WE2 and a portion having a second minimum linewidth NE2.

The linewidth of the first electrode C141 may gradually increase or decrease between the first minimum linewidth NE1 and the first maximum linewidth WE1, and the linewidth of the second electrode C142 may gradually increase or decrease between the second minimum linewidth NE2 and the second maximum linewidth WE2.

Further, the linewidth of the first electrode C141 and the linewidth of the second electrode C142 may be different from each other at two positions, which are separated from each other in the second direction y, considering that the first and second conductive lines CW1 and CW2 disposed in the second direction y crossing the first and second electrodes C141 and C142 are electrically connected to or insulated from the first and second electrodes C141 and C142.

When the first and second electrodes C141 and C142 have the above-described pattern, the first conductive line CW1 may be electrically connected to a portion of the first electrode C141 having the first maximum linewidth WE1 and may be insulated from a portion of the second electrode C142 having the second minimum linewidth NE2.

Further, the second conductive line CW2 may be electrically connected to a portion of the second electrode C142 having the second maximum linewidth WE2 and may be insulated from a portion of the first electrode C141 having the first minimum linewidth NE1.

Hence, a contact resistance between the first conductive line CW1 and the first electrode C141 and a contact resistance between the second conductive line CW2 and the second electrode C142 may be further improved. The insulation between the first conductive line CW1 and the second electrode C142 and the insulation between the second conductive line CW2 and the first electrode C141 may be more easily performed.

An average linewidth of the first electrode C141 connected to the emitter region 121 may be greater than an average linewidth of the second electrode C142 connected to the back surface field region 172 in consideration of a relative movement amount of holes.

To this end, as shown in FIG. 4, the first maximum linewidth WE1 of the first electrode C141 connected to the emitter region 121 may be greater than the second maximum linewidth WE2 of the second electrode C142 connected to the back surface field region 172.

Further, the second minimum linewidth NE2 of the second electrode C142 connected to the back surface field region 172 may be less than the first minimum linewidth NE1 of the first electrode C141 connected to the emitter region 121.

So far, the embodiment of the invention was described using an example where the first conductive type of the semiconductor substrate 110 is the n-type. However, if the first conductive type of the semiconductor substrate 110 is the p-type, the emitter region 121 may be of the n-type, and the back surface field region 172 may be of a p+-type. Therefore, holes may move to the back surface field region 172.

In this instance, on the contrary to the above-described linewidths, a linewidth of the back surface field region 172 may be greater than a linewidth of the emitter region 121, and a linewidth of the second electrode C142 connected to the back surface field region 172 may be greater than a linewidth of the first electrode C141 connected to the emitter region 121.

In the solar cell having the above-described structure according to the embodiment of the invention, holes collected by the first electrodes C141 and electrons collected by the second electrodes C142 may be used as electric power of an external device through an external circuit device.

The solar cell applied to the solar cell module according to the embodiment of the invention is not limited to FIGS. 2 and 3. The components of the solar cell may be variously changed, except that the first and second electrodes C141 and C142 included in the solar cell are formed on the back surface of the semiconductor substrate 110.

For example, the solar cell module according to the embodiment of the invention may use a metal wrap through (MWT) solar cell, that is configured such that a portion of the first electrode C141 and the emitter region 121 are positioned on the front surface of the semiconductor substrate 110, and the portion of the first electrode C141 is connected to a remaining portion of the first electrode C141 formed on the back surface of the semiconductor substrate 110 through a hole of the semiconductor substrate 110.

Figure 5:
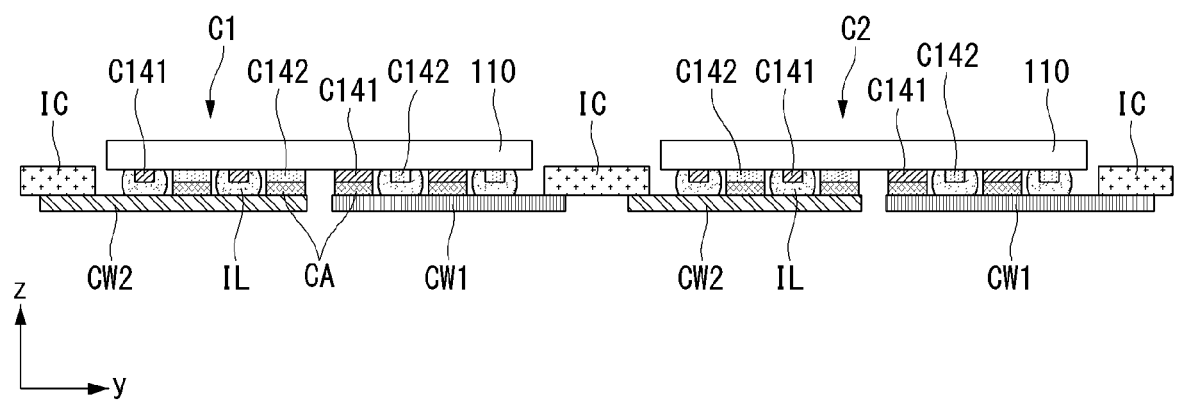
FIG. 5 is a cross-sectional view taken along line csx1-csx1 of FIG. 1.

FIG. 5 illustrates a cross-sectional structure, in which the plurality of solar cells each having above-described configuration are connected in series using the conductive lines and the intercell connector as shown in FIG. 1.

More specifically, FIG. 5 is a cross-sectional view taken along line csx1-csx1 of FIG. 1.

As shown in FIG. 5, a plurality of solar cells including a first solar cell C1 and a second solar cell C2 may be arranged in the second direction y.

A longitudinal direction of a plurality of first and second electrodes C141 and C142 included in the first and second solar cells C1 and C2 may correspond to the first direction x.

The first and second solar cells C1 and C2, that are arranged in the second direction y, may be connected in series to each other in the second direction y using first and second conductive lines CW1 and CW2 and an intercell connector IC to form a string.

The first and second conductive lines CW1 and CW2 and the intercell connector IC may be formed of a conductive metal material. The first and second conductive lines CW1 and CW2 may be connected to a back surface of a semiconductor substrate 110 of each solar cell and then may be connected to the intercell connector IC for a serial connection of the solar cells.

More specifically, the plurality of first conductive lines CW1 may overlap the plurality of first electrodes C141 included in each of the first and second solar cells C1 and C2 and may be connected to the plurality of first electrodes C141 through a conductive adhesive CA. Further, the plurality of first conductive lines CW1 may be insulated from the plurality of second electrodes C142 included in each of the first and second solar cells C1 and C2 through an insulating layer IL formed of an insulating material.

In this instance, as shown in FIGS. 1 and 5, each of the plurality of first conductive lines CW1 may protrude to the outside of the semiconductor substrate 110 toward the intercell connector IC disposed between the first and second solar cells C1 and C2.

The plurality of second conductive lines CW2 may overlap the plurality of second electrodes C142 included in each of the first and second solar cells C1 and C2 and may be connected to the plurality of second electrodes C142 through a conductive adhesive CA. Further, the plurality of second conductive lines CW2 may be insulated from the plurality of first electrodes C141 included in each of the first and second solar cells C1 and C2 through an insulating layer IL formed of an insulating material.

In this instance, as shown in FIGS. 1 and 5, each of the plurality of second conductive lines CW2 may protrude to the outside of the semiconductor substrate 110 toward the intercell connector IC disposed between the first and second solar cells C1 and C2.

The conductive adhesive CA may be formed of a metal material including tin (Sn) or Sn-containing alloy. For example, the metal material of the conductive adhesive CA may include at least one of SnIn, SnBi, SnPb, Sn, SnCuAg, or SnCu.

The conductive adhesive CA may be used in the form of one of a solder paste having a good adhesive strength between metal materials, a conductive adhesive paste in which metal particles are included in an insulating resin, and a conductive adhesive film.

The insulating layer IL may be made of any material as long as an insulating material is used. For example, the insulating layer IL may use one insulating material of an epoxy-based resin, an acrylic-based resin, and a silicone-based resin.

As shown in FIGS. 1 and 5, a portion protruding to the outside of the semiconductor substrate 110 in each of the first and second conductive lines CW1 and CW2 connected to the back surface of each solar cell may be connected to the back surface of the intercell connector IC between the first and second solar cells C1 and C2. Hence, the plurality of solar cells C1 and C2 may be connected in series to each other in the second direction y to form one string.

As shown in FIG. 5, the intercell connector IC may be positioned outside a projection area of the semiconductor substrate 110 of each of the first and second solar cells C1 and C2 and may be separated from the semiconductor substrate 110. The intercell connector IC may be directly connected to the first conductive lines CW1 of the first solar cell C1 and the second conductive lines CW2 of the second solar cell C2, or may be connected to them using a separate conductive adhesive.

As shown in FIG. 1, the intercell connector IC may be disposed between the semiconductor substrates 110 of the first and second solar cells C1 and C2 and may extend in the first direction x.

As shown in FIG. 1, a linewidth of the intercell connector IC may be equal to or greater than a linewidth of each of the plurality of first and second conductive lines CW1 and CW2, so as to secure a sufficient adhesive strength and a connection resistance.

Further, a thickness of the intercell connector IC may be equal to or greater than a thickness of each of the plurality of first and second conductive lines CW1 and CW2.

In the solar cell module according to the embodiment of the invention, when a bad connection between the first and second conductive lines CW1 and CW2 and the first and second electrodes C141 and C142 is generated in the plurality of solar cells, the first and second conductive lines CW1 and CW2 of a solar cell having the bad connection may be disconnected from the intercell connector IC. Hence, only the bad solar cell can be easily replaced.

A pattern of the first and second electrodes C141 and C142 of each solar cell according to the embodiment of the invention is described in detail below.

Figure 6:
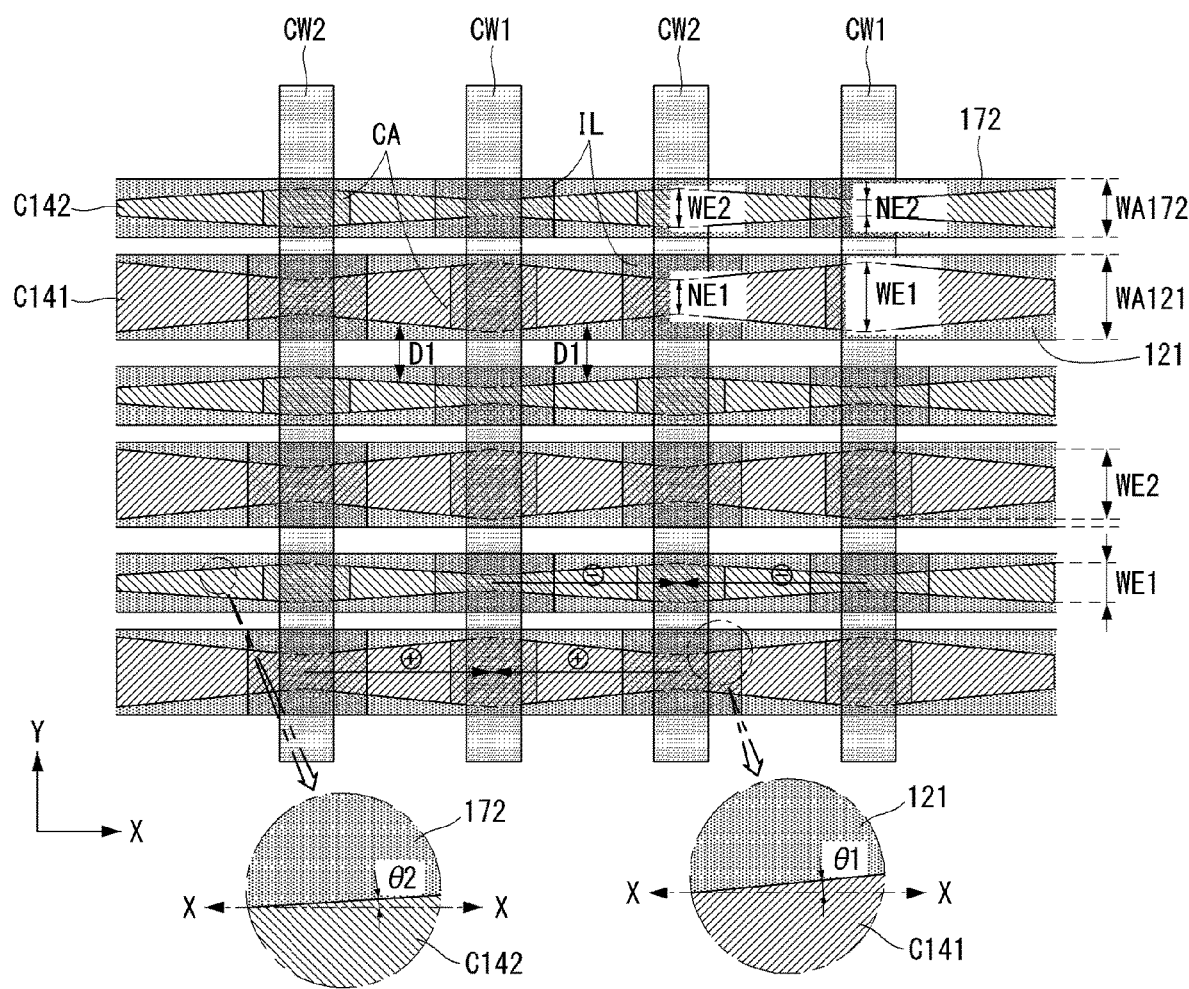
FIG. 6 illustrates in detail an example of a pattern of an emitter region and a back surface field region and an example of a pattern of first and second electrodes in a solar cell according to an embodiment of the invention.
Figure 9:
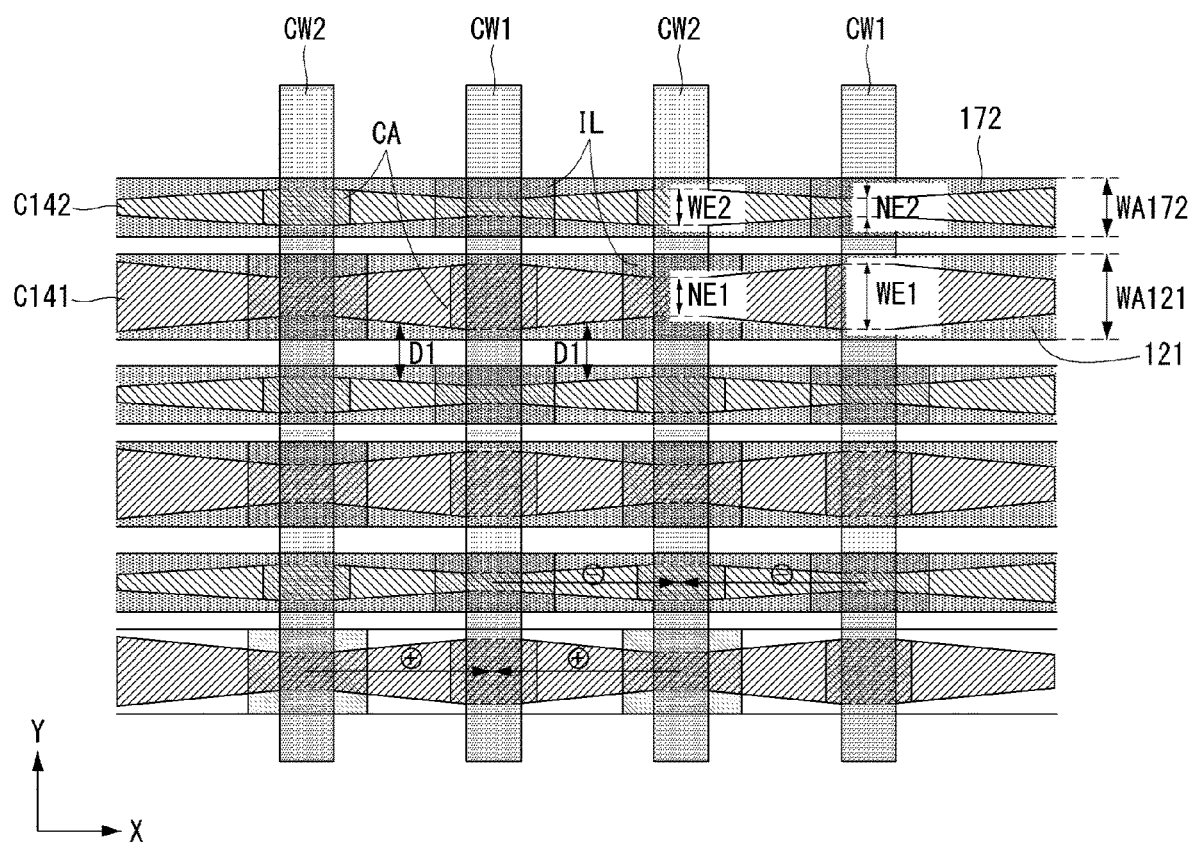
FIG. 9 is a modified example of FIG. 6 and illustrates an example where a linewidth of each of first and second electrodes is uniform in overlap portions of the first and second electrodes and first and second conductive lines.

FIG. 6 illustrates in detail a pattern of first and second electrodes and a connection relationship between first and second conductive lines in a solar cell according to an embodiment of the invention. FIG. 9 is a modified example of FIG. 6 and illustrates an example where a linewidth of each of first and second electrodes is uniform in overlap portions of the first and second electrodes and first and second conductive lines.

More specifically, FIG. 6 is a partially enlarged view showing that the first and second conductive lines CW1 and CW2 are connected to the back surface of the semiconductor substrate 110 including the emitter regions 121, the back surface field regions 172, and the first and second electrodes C141 and C142. In FIG. 6, it may be assumed that the first conductive type of the semiconductor substrate 110 is an n-type, the emitter region 121 is of a p-type, the back surface field region 172 is of an n-type, the first electrode C141 is formed on the emitter region 121, and the second electrode C142 is formed on the back surface field region 172.

As shown in FIG. 6, as each of the emitter region 121 and the back surface field region 172 goes toward (or along) the first direction x, each of the emitter region 121 and the back surface field region 172 may have a stripe shape having a uniform linewidth.

In FIG. 6, an average linewidth of one of the emitter region 121 and the back surface field region 172 may be greater than an average linewidth of the other.

For example, as shown in FIG. 6, when the first conductive type of the semiconductor substrate 110 is the n-type, the emitter region 121 is of the p-type, and the back surface field region 172 is of the n-type, an average linewidth WA121 of the emitter region 121 may be greater than an average linewidth WA172 of the back surface field region 172.

In this instance, a ratio of an average linewidth of one of the emitter region 121 and the back surface field region 172 to an average linewidth of the other may be, for example, 1:1.5 to 1:3. More specifically, the average linewidths WA121 and WA172 of the emitter region 121 and the back surface field region 172 may be equal to or greater than an average linewidth of each of the first and second electrodes C141 and C142. A ratio of the average linewidth WA172 of the back surface field region 172 to the average linewidth WA121 of the emitter region 121 may be 1:1.5 to 1:3.

Hence, a movement of holes having a relatively short moving distance can be more easily performed.

However, when the first conductive type of the semiconductor substrate 110 is the p-type, the emitter region 121 is of the n-type, and the back surface field region 172 is of the p-type, an average linewidth WA172 of the back surface field region 172 may be greater than an average linewidth WA121 of the emitter region 121, unlike FIG. 6.

As shown in FIG. 6, the first electrode C141 may have different linewidths at a crossing of the first electrode C141 and the first conductive line CW1 and a crossing of the first electrode C141 and the second conductive line CW2, wherein the crossings are separated from each other in the first direction x.

For example, the first electrode C141 may have a first maximum linewidth WE1 at a position where the first electrode C141 and the first conductive line CW1 cross each other and are electrically connected to each other, and may have a first minimum linewidth NE1 at a position where the first electrode C141 and the second conductive line CW2 cross each other and are insulated from each other, wherein the positions are separated from each other in the first direction x.

As the first electrode C141 goes toward (or along) the first direction x, the first electrode C141 may be formed by repeatedly disposing a portion having the first maximum linewidth WE1 and a portion having the first minimum linewidth NE1. The linewidth of the first electrode C141 may gradually increase or decrease.

Further, the second electrode C142 may have different linewidths at a crossing of the second electrode C142 and the first conductive line CW1 and a crossing of the second electrode C142 and the second conductive line CW2, wherein the crossings are separated from each other in the first direction x.

For example, the second electrode C142 may have a second minimum linewidth NE2 at a position where the second electrode C142 and the first conductive line CW1 cross each other and are insulated from each other, and may have a second maximum linewidth WE2 at a position where the second electrode C142 and the second conductive line CW2 cross each other and are electrically connected to each other, wherein the positions are separated from each other in the first direction x.

As the second electrode C142 goes toward (or along) the first direction x, the second electrode C142 may be formed by repeatedly disposing a portion having the second maximum linewidth WE2 and a portion having the second minimum linewidth NE2. The linewidth of the second electrode C142 may gradually increase or decrease.

The linewidth of the first electrode C141 at a crossing of the first electrode C141 and the first conductive line CW1 or the second conductive line CW2 may be different from the linewidth of the second electrode C142 at a crossing of the second electrode C142 and the first conductive line CW1 or the second conductive line CW2, wherein the crossings are separated from each other in the second direction y.

More specifically, a portion of the first electrode C141 having the first maximum linewidth WE1 and a portion of the second electrode C142 having the second minimum linewidth NE2 may be positioned on the same line in the second direction y. Further, a portion of the first electrode C141 having the first minimum linewidth NE1 and a portion of the second electrode C142 having the second maximum linewidth WE2 may be positioned on the same line in the second direction y.

Hence, a portion of the first electrode C141 having the first maximum linewidth WE1 and a portion of the second electrode C142 having the second minimum linewidth NE2 may cross and overlap the first conductive line CW1, and a portion of the first electrode C141 having the first minimum linewidth NE1 and a portion of the second electrode C142 having the second maximum linewidth WE2 may cross and overlap the second conductive line CW2.

The first conductive line CW1 may be connected to a portion of the first electrode C141 having the first maximum linewidth WE1 using the conductive adhesive CA and may be insulated from a portion of the second electrode C142 having the second minimum linewidth NE2 through the insulating layer IL.

Further, the second conductive line CW2 may be connected to a portion of the second electrode C142 having the second maximum linewidth WE2 using the conductive adhesive CA and may be insulated from a portion of the first electrode C141 having the first minimum linewidth NE1 through the insulating layer IL.

As described above, the first conductive line CW1 is electrically connected to a portion of the first electrode C141 having the first maximum linewidth WE1, and the second conductive line CW2 is electrically connected to a portion of the second electrode C142 having the second maximum linewidth WE2. Therefore, a contact resistance between the first and second conductive lines CW1 and CW2 and the first and second electrodes C141 and C142 can be minimized, and a physical adhesive strength between them can further increase.

Hence, a fill factor of each solar cell and durability of the solar cell module can be further improved.

The embodiment of the invention causes the second electrode C142 to have the second minimum linewidth NE2 at a crossing of the first conductive line CW1 and the second electrode C142 and causes the first electrode C141 to have the first minimum linewidth NE1 at a crossing of the second conductive line CW2 and the first electrode C141. Hence, the insulation between the first and second conductive lines CW1 and CW2 and the second and first electrodes C142 and C141 can be more surely performed. Further, an amount of the insulating layer IL consumed can further decrease, and thus the manufacturing cost of the solar cell and the solar cell module can be further reduced.

When holes (+) collected through the emitter region 121 move to a portion of the first electrode C141 having the first minimum linewidth NE1, the linewidth of the first electrode C141 may gradually increase from the first minimum linewidth NE1 to the first maximum linewidth WE1 as the holes move toward the first conductive line CW1 as indicated by an arrow. Thus, a lumped resistance in the longitudinal direction (i.e., the first direction) of the first electrode C141 can be further reduced.

Further, when electrons (−) collected through the back surface field region 172 move to a portion of the second electrode C142 having the second minimum linewidth NE2, the linewidth of the second electrode C142 may gradually increase from the second minimum linewidth NE2 to the second maximum linewidth WE2 as the electrons move toward the second conductive line CW2 as indicated by an arrow. Thus, a lumped resistance in the longitudinal direction (i.e., the first direction) of the second electrode C142 can be further reduced.

Hence, the fill factor of the solar cell can be further improved.

The average linewidth of the first electrode C141 may be greater than the average linewidth of the second electrode C142. A ratio of the average linewidth of the second electrode C142 to the average linewidth of the first electrode C141 may be 1:1.5 to 1:3.

When the linewidth of the first electrode C141 increases from the first minimum linewidth NE1 to the first maximum linewidth WE1, an angle $\theta1$ formed when increasing the linewidth of the first electrode C141 may be 5° to 85° with respect to the first direction x. The angle $\theta1$ is an angle formed by one side of the first electrode C141 and the first direction x (or a central axis of the first electrode C141).

Further, when the linewidth of the second electrode C142 increases from the second minimum linewidth NE2 to the second maximum linewidth WE2, an angle $\theta2$ formed when increasing the linewidth of the second electrode C142 may be 5° to 85° with respect to the first direction x. The angle $\theta2$ is an angle formed by one side of the second electrode C142 and the first direction x (or a central axis of the second electrode C142).

More preferably, the angle $\theta2$ formed when increasing the linewidth of the second electrode C142 may be equal to or less than the angle $\theta1$ formed when increasing the linewidth of the first electrode C141 within the above numerical range. Namely, $\theta2 \leq \theta1$.

As described above, in the embodiment of the invention, a linewidth of a portion of the first electrode C141 electrically connected to the first conductive line CW1 may be greater than a linewidth of a portion of the second electrode C142 insulated from the first conductive line CW1. Further, a linewidth of a portion of the second electrode C142 electrically connected to the second conductive line CW2 may be greater than a linewidth of a portion of the first electrode C141 insulated from the second conductive line CW2.

A ratio of the first minimum linewidth NE1 to the first maximum linewidth WE1 of the first electrode C141 may be 1:2 to 1:10, and a ratio of the second minimum linewidth NE2 to the second maximum linewidth WE2 of the second electrode C142 may be 1:2 to 1:8.

For example, when the first minimum linewidth NE1 of the first electrode C141 is 50 µm, the first maximum linewidth WE1 of the first electrode C141 may be 100 µm to 500 µm. When the second minimum linewidth NE2 of the second electrode C142 is 50 µm, the second maximum linewidth WE2 of the second electrode C142 may be 100 µm to 400 µm.

A ratio of the second minimum linewidth NE2 of the second electrode C142 overlapping one first conductive line CW1 to the first maximum linewidth WE1 of the first electrode C141 may be 1:2 to 1:10. Further, a ratio of the first minimum linewidth NE1 of the first electrode C141 overlapping one second conductive line CW2 to the second maximum linewidth WE2 of the second electrode C142 may be 1:2 to 1:8.

Within the above numerical range, the ratio of the second minimum linewidth NE2 of the second electrode C142 overlapping one first conductive line CW1 to the first maximum linewidth WE1 of the first electrode C141 may be different from the ratio of the first minimum linewidth NE1 of the first electrode C141 overlapping one second conductive line CW2 to the second maximum linewidth WE2 of the second electrode C142.

For example, when the second minimum linewidth NE2 overlapping one first conductive line CW1 is 100 µm, the first maximum linewidth WE1 may be 360 µm. In this instance, the ratio of the second minimum linewidth NE2 of the second electrode C142 overlapping one first conductive line CW1 to the first maximum linewidth WE1 of the first electrode C141 may be 1:3.6.

On the other hand, when the first minimum linewidth NE1 overlapping one second conductive line CW2 is 100 µm, the second maximum linewidth WE2 may be 280 µm. In this instance, the ratio of the first minimum linewidth NE1 of the first electrode C141 overlapping one second conductive line CW2 to the second maximum linewidth WE2 of the second electrode C142 may be 1:2.8.

Namely, the first maximum linewidth WE1 may be greater than the second maximum linewidth WE2, and the first minimum linewidth NE1 may be equal to the second minimum linewidth NE2. Further, the first minimum linewidth NE1 may be greater than the second minimum linewidth NE2.

The description of FIGS. 5 and 6 was written using an example where the first conductive type of the semiconductor substrate 110 is the n-type, the emitter region 121 is of the p-type, the back surface field region 172 is of the n-type, the first electrode C141 is formed on the emitter region 121, and the second electrode C142 is formed on the back surface field region 172.

Unlike FIGS. 5 and 6, when the first conductive type of the semiconductor substrate 110 is a p-type, the emitter region 121 is of an n-type, the back surface field region 172 is of a p-type, the first electrode C141 is formed on the emitter region 121, and the second electrode C142 is formed on the back surface field region 172, an average linewidth of the second electrode C142 may be greater than an average linewidth of the first electrode C141, and a second maximum linewidth WE2 of the second electrode C142 may be greater than a first maximum linewidth WE1 of the first electrode C141.

Returning again to FIGS. 5 and 6, when the first maximum linewidth WE1 is greater than the second maximum linewidth WE2 and the first minimum linewidth NE1 is greater than the second minimum linewidth NE2, a distance between the first and second electrodes C141 and C142 may be substantially uniform in a margin of error of 10%.

The description of FIGS. 5 and 6 was written using an example where both sides of each of the first and second electrodes C141 and C142 form a predetermined angle with the first direction x (or a central axis of each of the first and second electrodes C141 and C142) and the linewidth of each of the first and second electrodes C141 and C142 gradually increases or decreases. Unlike FIGS. 5 and 6, one side of each of the first and second electrodes C141 and C142 may form a predetermined angle with the first direction x (or a remaining side of each of the first and second electrodes C141 and C142), and the linewidth of each of the first and second electrodes C141 and C142 may be repeatedly changed while gradually increasing or decreasing.

FIG. 6 illustrates that the linewidth of each of the first and second electrodes C141 and C142 is changed in overlapping portions between the first and second electrodes C141 and C142 and the first and second conductive lines CW1 and CW2, as an example. Unlike FIG. 6, as shown in FIG. 9, the linewidth of each of the first and second electrodes C141 and C142 may be uniformly maintained without a change (for example, an increase or a decrease) in the linewidth in overlapping portions between the first and second electrodes C141 and C142 and the first and second conductive lines CW1 and CW2.

Figure 7:
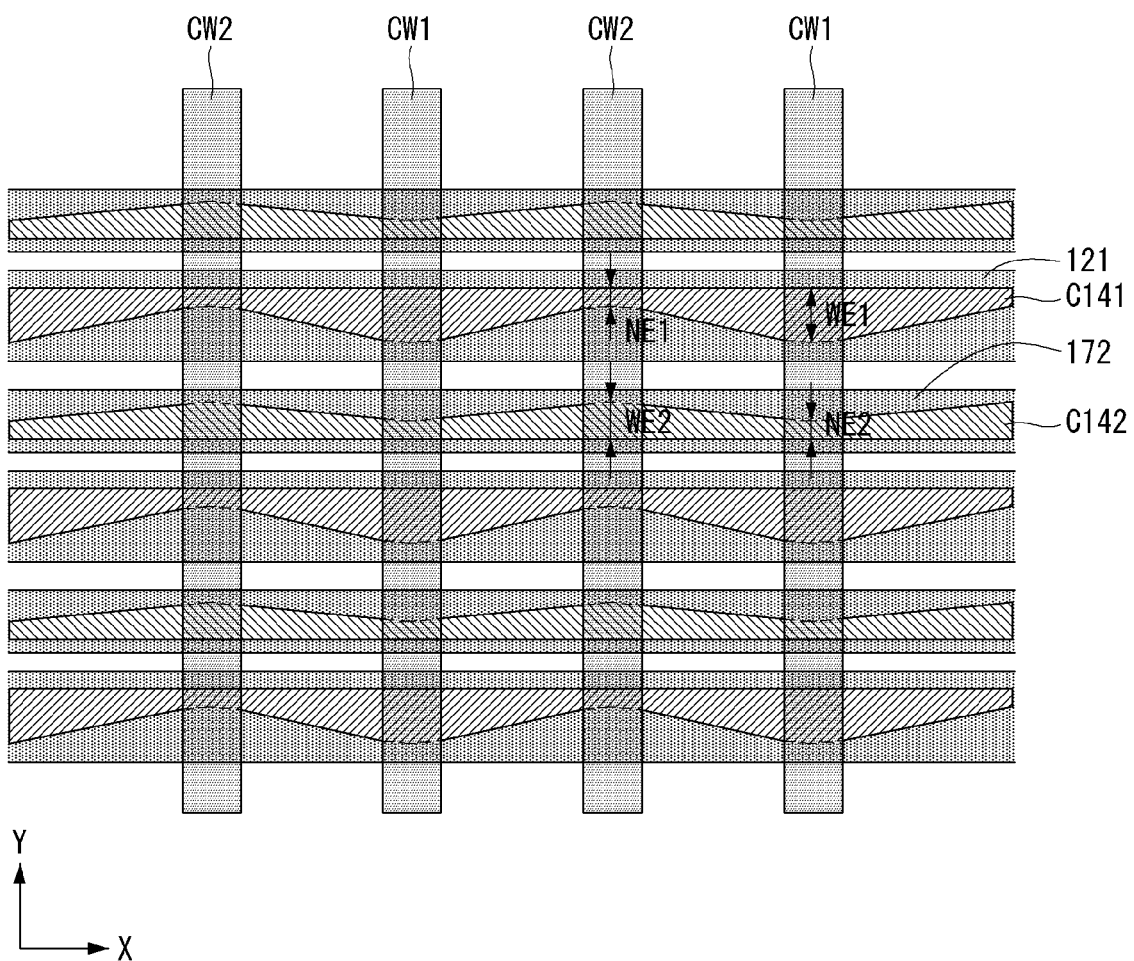
FIG. 7 illustrates another example of a pattern of first and second electrodes in a solar cell according to an embodiment of the invention.

FIG. 7 illustrates another example of a pattern of first and second electrodes in a solar cell according to an embodiment of the invention.

As shown in FIG. 7, as another example of a pattern of the first and second electrodes C141 and C142, one side of each of the first and second electrodes C141 and C142 may form a predetermined angle with the first direction x (or a remaining side of each of the first and second electrodes C141 and C142), and the linewidth of each of the first and second electrodes C141 and C142 may be repeatedly changed while gradually increasing or decreasing.

Hence, as the first and second electrodes C141 and C142 go toward the first direction x, portions having first and second maximum linewidths WE1 and WE2 and portions having first and second minimum linewidths NE1 and NE2 may be repeatedly formed, and a linewidth of each of the first and second electrodes C141 and C142 may be repeatedly changed while gradually increasing or decreasing.

Numerical ranges of the first and second maximum linewidths WE1 and WE2 and the first and second minimum linewidths NE1 and NE2 may be substantially equal to the numerical ranges described in FIG. 5.

FIGS. 6 and 7 illustrate that only the linewidth of each of the first and second electrodes C141 and C142 may be repeatedly and gradually changed without changing a linewidth of the emitter region 121 and a linewidth of the back surface field region 172, as an example. Unlike this, a linewidth of the emitter region 121 and a linewidth of the back surface field region 172 may be repeatedly and gradually changed as they go toward the first direction x.

Figure 8:
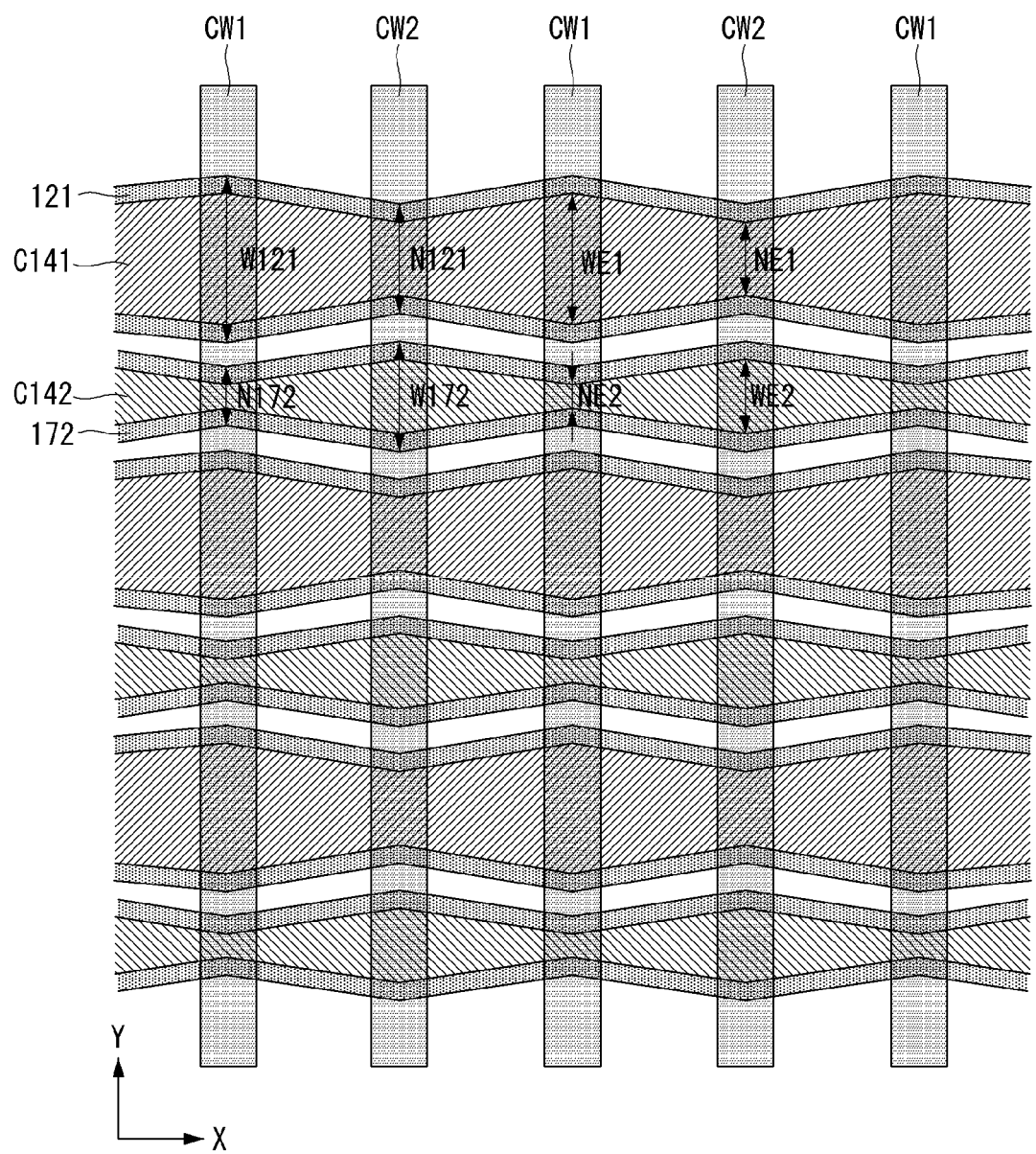
FIG. 8 illustrates another example of a pattern of an emitter region and a back surface field region in a solar cell according to an embodiment of the invention.

FIG. 8 illustrates another example of a pattern of an emitter region and a back surface field region in a solar cell according to an embodiment of the invention.

As shown in FIG. 8, a linewidth of the emitter region 121 and a linewidth of the back surface field region 172 may be repeatedly and gradually changed while increasing and decreasing in response to a change in the linewidth of each of the first and second electrodes C141 and C142 as they go toward the first direction x, in such a way that the linewidth of each of the first and second electrodes C141 and C142 is repeatedly and gradually changed.

More specifically, the emitter region 121 may have a maximum linewidth W121 in a portion of the first electrode C141 having a first maximum linewidth WE1 and have a minimum linewidth N121 in a portion of the first electrode C141 having a first minimum linewidth NE1.

Further, the back surface field region 172 may have a maximum linewidth W172 in a portion of the second electrode C142 having a second maximum linewidth WE2 and have a minimum linewidth N172 in a portion of the second electrode C142 having a second minimum linewidth NE2.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A solar cell comprising:
a semiconductor substrate;
an emitter region on a back surface of the semiconductor substrate and extending in a first direction;
a back surface field region on the back surface of the semiconductor substrate and extending in the first direction in parallel with the emitter region;
a first electrode on a back surface of the emitter region and extending in the first direction; and
a second electrode on a back surface of the back surface field region and extending in the first direction,
wherein the first electrode includes a plurality of first portions each having a first maximum linewidth and a plurality of second portions each having a first minimum linewidth, the plurality of first minimum linewidths of the plurality of second portions being smaller than the plurality of first maximum linewidths of the plurality of first portions,
wherein the plurality of first portions and the plurality of second portions are alternately provided along the first direction,
wherein the second electrode includes a plurality of third portions each having a second maximum linewidth and a plurality of fourth portions each having a second minimum linewidth, the plurality of second minimum linewidths of the plurality of fourth portions being smaller than the plurality of second maximum linewidths of the plurality of third portions,
wherein the plurality of third portions and the plurality of fourth portions are alternately provided along the first direction,
wherein the plurality of first maximum linewidths of the plurality of first portions are greater than the plurality of second maximum linewidths of the plurality of third portions, and the plurality of first minimum linewidths of the plurality of second portions are greater than the plurality of second minimum linewidths of the plurality of fourth portions, and
wherein a linewidth of the first electrode gradually decreases between one first portion of the plurality of first portions and one second portion of the plurality of second portions that are directly adjacent in the first direction, and a linewidth of the second electrode gradually decreases between one third portion of the plurality of third portions and one fourth portion of the plurality of fourth portions that are directly adjacent in the first direction.

2. The solar cell of claim 1, wherein the one first portion of the first electrode having the first maximum linewidth and the one fourth portion of the second electrode having the second minimum linewidth are aligned in a second direction crossing the first direction, and
wherein the one second portion of the first electrode having the first minimum linewidth and the one third portion of the second electrode having the second maximum linewidth are aligned in the second direction.

3. The solar cell of claim 1, wherein when the linewidth of the first electrode increases from the one second portion to the one first portion that is adjacent thereto in the first direction, an angle formed when increasing the linewidth of the first electrode is 5° to 85° with respect to the first direction.

4. The solar cell of claim 3, wherein when the linewidth of the second electrode increases from the one fourth portion to the one third portion that is adjacent thereto in the first direction, an angle formed when increasing the linewidth of the second electrode is 5° to 85° with respect to the first direction.

5. The solar cell of claim 4, wherein the angle formed when increasing the linewidth of the second electrode is equal to or less than the angle formed when increasing the linewidth of the first electrode.

6. The solar cell of claim 1, wherein an average linewidth of the first electrode is greater than an average linewidth of the second electrode, and wherein a ratio of the average linewidth of the second electrode to the average linewidth of the first electrode is 1:1.5 to 1:3.

7. The solar cell of claim 1, wherein a ratio of the one first minimum linewidth to the one first maximum linewidth that is adjacent thereto in the first direction of the first electrode is 1:2 to 1:10, and wherein a ratio of the one second minimum linewidth to the one second maximum linewidth that is adjacent thereto in the first direction of the second electrode is 1:2 to 1:8.

8. The solar cell of claim 1, wherein as each of the emitter region and the back surface field region goes along the first direction, each of the emitter region and the back surface field region has a stripe shape having a uniform linewidth.

9. The solar cell of claim 8, wherein an average linewidth of one of the emitter region and the back surface field region is greater than an average linewidth of the other.

10. The solar cell of claim 1, wherein a linewidth of each of the emitter region and the back surface field region is repeatedly and gradually changed as the emitter region and the back surface field region go along the first direction.

11. The solar cell of claim 10, wherein, the emitter region has a plurality of maximum linewidths overlapping the plurality of first portions of the first electrode having the plurality of first maximum linewidths and has a plurality of minimum linewidths overlapping the plurality of second portions of the first electrode having the plurality of first minimum linewidths, and wherein, the back surface field region has a plurality of maximum linewidths overlapping the plurality of third portions of the second electrode having the plurality of second maximum linewidths and has a plurality of minimum linewidths overlapping the plurality of fourth portions of the second electrode having the plurality of second minimum linewidths.

* * * * *